(12) United States Patent
Sugawara et al.

(10) Patent No.: US 6,610,920 B2
(45) Date of Patent: Aug. 26, 2003

(54) PHOTOELECTRIC CONVERSION DEVICE

(75) Inventors: Shin Sugawara, Yokaichi (JP); Takeshi Kyoda, Yokaichi (JP); Hisao Arimune, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/965,449

(22) Filed: Sep. 26, 2001

(65) Prior Publication Data

US 2002/0056474 A1 May 16, 2002

(30) Foreign Application Priority Data

Sep. 28, 2000 (JP) ........................ 2000-297621

(51) Int. Cl.⁷ ................. H01L 31/0256; H01L 31/0352
(52) U.S. Cl. ........................ 136/250; 136/258; 136/261; 257/461
(58) Field of Search ................................ 136/250, 258, 136/261; 423/348, 349; 438/63; 117/73, 77, 78, 84, 88, 92, 103, 11; 257/461

(56) References Cited

U.S. PATENT DOCUMENTS

| | | | | |
|---|---|---|---|---|
| 4,377,564 A | * | 3/1983 | Dahlberg | 423/349 |
| 4,691,076 A | | 9/1987 | Levine et al. | 136/250 |
| 4,947,219 A | * | 8/1990 | Boehm | 257/471 |
| 5,326,547 A | * | 7/1994 | Allen et al. | 423/349 |
| 5,498,576 A | * | 3/1996 | Hotchkiss et al. | 438/63 |
| RE35,242 E | * | 5/1996 | Kajimoto et al. | 117/31 |
| 6,074,476 A | | 6/2000 | Hanabe et al. | 117/11 |
| 6,211,454 B1 | * | 4/2001 | Sano | 136/258 |
| 6,358,313 B1 | * | 3/2002 | Tsuchimoto et al. | 117/8 |
| 6,417,442 B1 | * | 7/2002 | Fukui et al. | 136/250 |

* cited by examiner

Primary Examiner—Nam Nguyen
Assistant Examiner—Brian L Mutschler
(74) Attorney, Agent, or Firm—Hogan & Hartson, LLP

(57) ABSTRACT

Plasma is generated from a plasma generating gas comprising an inert gas and hydrogen gas. Silicon material is passed through the plasma and heated so as to form a crystalline silicon particle containing hydrogen at a concentration of $1 \times 10^{16}$–$1 \times 10^{20}$. A great number of the crystalline silicon particles of p-type or n-type are deposited on a substrate as the electrode of one side. An insulator is formed among the crystalline silicon particles on the substrate, and a n-type or p-type semiconductor layer is formed over the crystalline silicon particles, thereby fabricating a photoelectric conversion device. The photoelectric conversion device using the crystalline silicon particles exhibits high photoelectric conversion efficiency.

1 Claim, 2 Drawing Sheets

PHOTOELECTRIC CONVERSION DEVICE

This application is based on an application No. 2000-297621 filed in Japan, the content of which is incorporated hereinto by reference.

BACKGROUND OF THE INVENTION

1. Field of the Invention

The present invention relates to a crystalline silicon particle, a method of producing the same, and a photoelectric conversion device using the crystalline silicon particle produced by the method.

2. Description of the Related Art

Advent of a next-generation, low-cost solar cell that allows the quantity of silicon material to be small has been eagerly awaited. As one of such photoelectric conversion devices, a photoelectric conversion device in which granular or spherical crystalline silicon particles are used has been known. (Refer to U.S. Pat. No. 4,691,076)

The method of producing the crystalline silicon particles used in such a photoelectric conversion device is as follows: silicon particles having irregular shapes are used as the raw material and dropped inside a drop tube. While falling inside the drop tube, the silicon particles pass through an inductively coupled plasma torch that has been generated inside the drop tub so as to be fused and formed into spherical monocrystal silicon particles (Refer to U.S. Pat. No. 6,074,476).

However, the spherical monocrystal silicon particles produced by such a conventional production method suffer defects remaining inside the particles, which causes the photoelectric conversion efficiency to drop.

Accordingly, it has been impossible for conventional methods to produce crystalline silicon particles that can be suitably used in a photoelectric conversion device.

It is an object of this invention to provide a crystalline silicon particle that makes it possible to obtain a photoelectric conversion device having excellent characteristics, a method of producing the same, and a photoelectric conversion device using the crystalline silicon particle.

BRIEF SUMMARY OF THE INVENTION

The crystalline silicon particle according to the present invention contains hydrogen at a concentration of $1 \times 10^{16} - 1 \times 10^{20}$ atoms/cm$^3$. The hydrogen combines with dangling bond in the crystalline silicon particle so as to inactivate defects at crystal grain boundaries or within the crystal grain. As a result, it is possible to prolong the lives of carriers in the semiconductor and improve the photoelectric conversion efficiency.

A method of producing a crystalline silicon particle according to this invention comprises the steps of: generating plasma by ionizing a plasma generating gas having an inert gas and hydrogen gas mixed together in a prescribed ratio; passing a silicon material through the plasma; and producing a crystalline silicon particle containing hydrogen at a concentration of $1 \times 10^{16} - 1 \times 10^{20}$ atoms/cm$^3$.

According to this method, it is possible to easily add hydrogen having a concentration within a prescribed range to the crystalline silicon particle by blending hydrogen with the plasma generating gas.

Crystalline silicon particles tend to have a great deal of defects especially when produced by a gravitational falling method in which the crystalline silicon particles are rapidly crystal-grown. However, even in such a case, the method of producing a crystalline silicon particle according to the present invention can inactivate the defects by adding hydrogen to the crystalline silicon particles.

In addition, it is also possible to determine the conductivity type of the crystalline silicon particle by adding a gas containing an impurity element to the plasma generating gas.

The photoelectric conversion device using the crystalline silicon particle of the present invention comprises: a substrate; numerous first-conductivity-type crystalline silicon particles deposited on the substrate being in contact with the substrate; an insulator formed in clearances among the crystalline silicon particles on the substrate; and an opposite-conductivity-type semiconductor layer formed over the crystalline silicon particles and the insulator for forming a pn-junction between the layer and the crystalline silicon particles, wherein the crystalline silicon particles contain hydrogen at a concentration of $1 \times 10^{16} - 1 \times 10^{20}$ atoms/cm$^3$. Having the structure above, the present invention can provide a photoelectric conversion device with high photoelectric conversion efficiency.

DETAILED DESCRIPTION OF THE INVENTION

METHOD OF PRODUCING A CRYSTALLINE SILICON PARTICLE (1)

Figure 1:
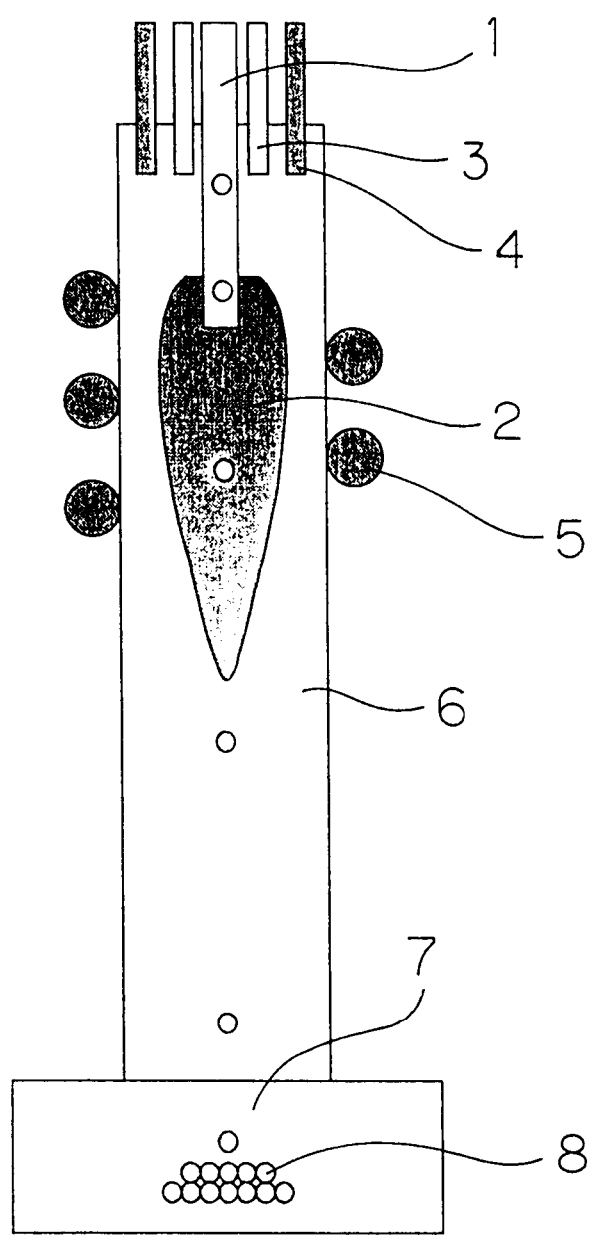
FIG. 1 illustrates an embodiment of the device for implementing the method of producing a crystalline silicon particle according to the present invention.

FIG. 1 is a view for illustrating a method of producing a crystalline silicon particle according to the present invention.

A material feeding nozzle is denoted by 1, a plasma flame is denoted by 2, and a plasma generating gas supplying nozzle is denoted by 3. The numerals 4, 5, 6, and 7 denote a coolant gas feeding nozzle, a high-frequency induction coil, a chamber, and a collecting section, respectively. The numeral 8 denotes a crystalline silicon particle containing hydrogen that is produced by the method of producing a crystalline silicon particle according to the present invention.

The plasma generating gas supplying nozzle 3 is a nozzle for supplying a plasma generating gas to a plasma generating section within the chamber 6. The plasma generating gas preferably comprises an inert gas and hydrogen gas. Helium, neon, argon or the like may be used as the inert gas.

It is also possible to add a gas containing a group III element such as diborane or a gas containing a group V element such as phosphine to the plasma generating gas so as to carry out doping for adding an impurity to the semiconductor material.

The high-frequency induction coil 5 is a coil for supplying electric power from a high-frequency power source and generating high-frequency energy so as to ionize the plasma generating gas inside the chamber 6 to bring it into a plasma state. The electric power to be supplied is normally in the range of 20–100 kW, and its frequency is from 2 to 20 MHz.

The chamber 6 comprises an insulator that is not heated by high-frequency induction heating. It is possible to control the cooling profile for cooling the semiconductor particle 8 that has been heated by the plasma flame by adjusting the length of the chamber 6, introducing coolant gas into the chamber 6 or providing a heater.

The coolant gas feeding nozzle 4 is a nozzle for protecting the chamber 6 from the high temperature of the plasma and cooling the chamber 6. It supplies a coolant gas along the inner wall of the chamber 6. The coolant gas should preferably have the same composition as that of the plasma generating gas.

The material feeding nozzle 1 is a nozzle for feeding the raw material that has been supplied from a material feeder or the like into the plasma. It is also possible to dispose a heating mechanism between the material feeder and the material feeding nozzle 1 so as to preheat the material.

The edge of the material feeding nozzle 1 should be disposed in the plasma. By disposing the edge of the material feeding nozzle 1 in the plasma, the material can be securely fed into the plasma so that the crystalline silicon particles can be stably produced. In such a case, since the material feeding nozzle 1 is exposed to the plasma and thereby heated, a cooling mechanism using water or the like is necessary.

The plasma flame 2 is a part in which the plasma generation gas has been ionized by high-frequency induction and brought into a plasma state. The temperature in this part is from 3000 to 10000 K. The material is heated while it passes through the plasma flame 2. The heated material falls below the chamber 6.

As described above, since the plasma generation gas contains hydrogen gas, radical hydrogen inside the plasma is combined with dangling bond in the crystal of the crystalline silicon particle so that defects at the crystal grain boundaries or within the crystal grain can be inactivated. As a result, it is possible to prolong the lives of carriers in the semiconductor, thereby improving the photoelectric conversion efficiency. This effect is more remarkably seen in the case of crystalline silicon particles that have been crystal-grown at a fast growth rate and have a great deal of defects.

It follows that by adding hydrogen to the plasma generating gas, defects in the crystalline silicon particle can be inactivated, which makes it possible to improve the photoelectric conversion efficiency of crystalline silicon particles that are produced at a high speed by a dropping method and rapidly crystal-grown.

The collecting section 7 is a section for collecting granular crystalline semiconductor particles produced through a series of processes. In order to absorb the dropping impact of the semiconductor particle 8 during the collection, the collecting section 7 may be filled with liquid.

The hydrogen-containing crystalline silicon particle 8 produced through the steps above is monocrystal, polycrystalline, or microcrystalline. The hydrogen-containing crystalline silicon particle 8 preferably contains hydrogen at a concentration of $1 \times 10^{16}$–$1 \times 10^{20}$ atoms/cm$^3$. When the hydrogen concentration is below $1 \times 10^{16}$ atoms/cm$^3$, defects inside the particle cause the photoelectric conversion efficiency to drop. When the hydrogen concentration exceeds $1 \times 10^{20}$ atoms/cm$^3$, crystal defects increase so that the photoelectric conversion efficiency is lowered. A more desirable range for the hydrogen concentration is from $1 \times 10^{17}$ to $1 \times 10^{20}$ atoms/cm$^3$.

METHOD OF PRODUCING A CRYSTALLINE SILICON PARTICLE(2)

Figure 2:
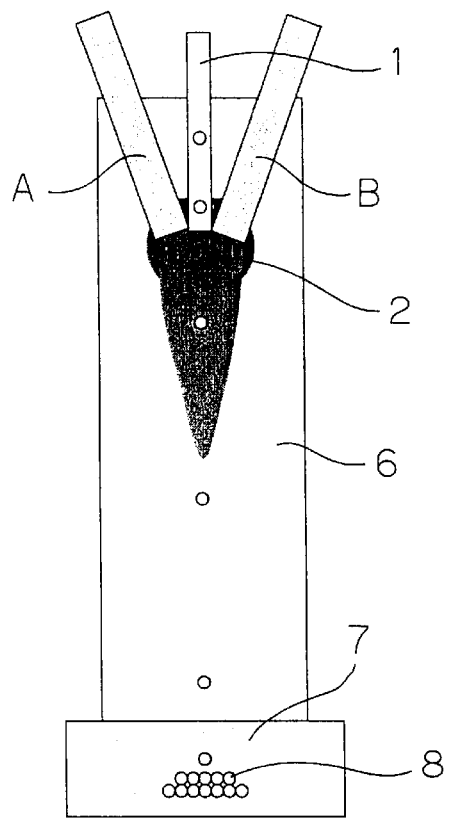
FIG. 2 illustrates another embodiment of the device for implementing the method of producing a crystalline silicon particle according to the present invention.

FIG. 2 illustrates another embodiment of the method of producing a crystalline silicon particle according to the present invention. An example in which inductively coupled plasma is used is shown in FIG. 1. In FIG. 2, an example using direct current plasma is shown.

In FIG. 2, direct current plasma torches for generating direct current arc plasma are denoted by A and B. Two direct current arc plasmas are overlapped each other and directed toward the central part of the plasma flame as shown in FIG. 2. Thus, granular crystalline semiconductors can be stably produced.

More desirably, a material feeding nozzle 1 is disposed inside the plasma flame where the two direct current arc plasmas are overlapped each other. In addition, the plasma generating gas should preferably comprise an inert gas and hydrogen gas similarly to the case where inductively coupled plasma is used. This makes it possible to add hydrogen to the plasma generating gas so as to inactivate defects in the same way as the production method shown in FIG. 1, and therefore it is possible to improve the photoelectric conversion efficiency as well as to produce crystalline semiconductor particles at a high speed. Although two direct current plasma torches are used in the embodiment shown in FIG. 2, the number of the direct current plasma torches is not limited to any specific number but may be designed appropriately according to the processing capacity.

OTHER PRODUCTION METHODS

It is also possible to combine the plasmas shown in FIGS. 1 and 2 together. For example, the combination can be made by combining the same kind of plasmas: (a) inductively coupled plasma+inductively coupled plasma and (b) direct current plasma+direct current plasma, or by combining the different kinds of plasmas: (c) direct current plasma+inductively coupled plasma. In addition, it is possible to combine a plurality of plasmas and regulate the heating time in accordance with the intended purpose, or a plurality of plasmas may be supplied with plasma generating gases each of which contains an element that is different from the elements contained in the others so that the different elements are added to the semiconductor particle. When a plurality of plasmas are used to add different elements to the semiconductor particle, the impurity addition can be accomplished in different depths by regulating the powers of the plurality of plasmas or the order of the processes. Accordingly, it is possible to form a pn-junction on the surface of the semiconductor particle within a series of dropping processes.

PHOTOELECTRIC CONVERSION DEVICE

Figure 3:
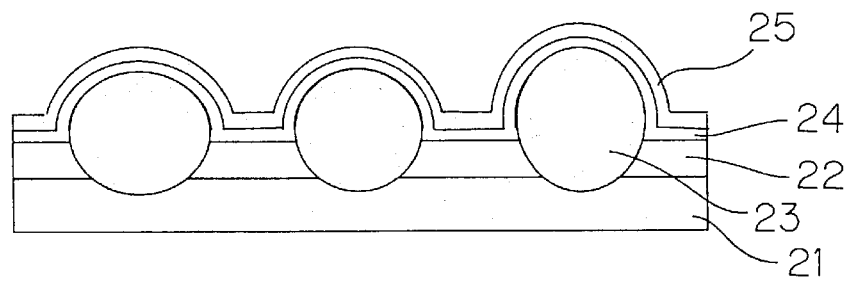
FIG. 3 illustrates an embodiment of the photoelectric conversion device using the crystalline silicon particle produced by the method of this invention.

FIG. 3 illustrates an embodiment of the photoelectric conversion device using the crystalline silicon particle produced by the above method. In FIG. 3, the numerals 21, 22, 23, 24, and 25 denote a substrate, an insulating layer, a crystalline silicon particle, an opposite-conductivity-type semiconductor layer, and the other electrode, respectively.

The substrate 21 comprises metal, ceramics, or resin. When this substrate 21 is an insulator, a conductive layer comprising aluminum or the like is formed on the surface so as to form an electrode.

The insulating layer 22 is formed for separating the positive electrode from the negative electrode. This insulating layer 22 comprises, for example, glass composed of $SiO_2$, $Al_2O_3$, $PbO$, $ZnO$, or the like.

The crystalline silicon particle 23 is produced by the method described above, and is monocrystal, polycrystalline or microcrystalline. It contains inside thereof hydrogen for compensating crystal defects in the silicon particle. The hydrogen content is preferably from $1\times10^{16}$ to $1\times10^{20}$ atoms/cm$^3$. Also, this crystalline silicon particle 23 contains a first-conductivity-type semiconductor impurity.

The opposite-conductivity-type semiconductor layer 24 is formed for forming a semiconductor junction between it and the crystalline silicon particle 23. This semiconductor layer 24 may be monocrystal, polycrystalline, or microcrystalline. It is also possible to make the semiconductor layer 24 contain an opposite-conductivity-type semiconductor impurity of high concentration in order to make the semiconductor layer 24 function as the opposite electrode. In this case, the other electrode 25 is not necessary.

When the other electrode 25 is to be formed, it may comprise a transparent conductive film such as ITO.

EXAMPLE

An example of the present invention is hereinafter described.

First, referring to FIG. 1, the high-frequency induction coil 5 was supplied with electric power of 30 kW having a frequency of 5 MHz so as to generate high-frequency energy, by which a plasma generating gas that was supplied from the plasma generating gas feeding nozzle 3 into the chamber 6 was ionized and the plasma flame 2 was generated. In this condition, silicon material was fed from the material feeding nozzle 1 into the chamber 6. Crushed silicon particles of which average weight was 0.05 mg were used as the silicon material. The silicon material injected into the plasma flame 2 from the material feeding nozzle 1 was heated inside the plasma and fused. Simultaneously, a coolant gas was supplied from the coolant gas feeding nozzle 4 along the inner wall of the chamber 6 so as to protect and cool the chamber 6. A gas comprising a mixture of argon gas and hydrogen gas was used for the plasma generating gas and the coolant gas. The hydrogen concentration in the hydrogen-containing crystalline silicon particles was varied by changing the argon-hydrogen mixing ratio, and the photoelectric conversion efficiency was evaluated in each case. The result of this evaluation is shown in Table 1.

TABLE 1

| Sample No. | Hydrogen concentration (atoms/cm$^3$) | Conversion efficiency (%) |
|---|---|---|
| 1* | $1 \times 10^{15}$ | 6.1 |
| 2 | $1 \times 10^{16}$ | 9.5 |
| 3 | $1 \times 10^{17}$ | 12.4 |
| 4 | $1 \times 10^{18}$ | 13.6 |
| 5 | $1 \times 10^{19}$ | 13.7 |
| 6 | $1 \times 10^{20}$ | 12.3 |
| 7* | $1 \times 10^{21}$ | 3.2 |
| 8* | $1 \times 10^{22}$ | 0.2 |

The samples marked by * are not included in the range stated by this invention.

As is apparent from the result above, in order to achieve a photoelectric conversion efficiency of more than 9%, the hydrogen-containing crystalline silicon particle should contain hydrogen at a concentration of $1\times10^{16}$–$1\times10^{20}$ atoms/cm$^3$, and more desirably, it should contain hydrogen at a concentration of $1\times10^{17}$–$1\times10^{20}$ atoms/cm$^3$ so to achieve a photoelectric conversion efficiency of more an 10%.

What is claimed is:

1. A photoelectric conversion device comprising:

a substrate;

numerous first-conductivity-type crystalline silicon particles deposited on the substrate being in contact with the substrate;

an insulator formed in clearances among the crystalline silicon particles on the substrate; and an opposite-conductivity-type semiconductor layer formed over the crystalline silicon particles and the insulator for forming a pn-junction between the layer and the crystalline silicon particles, wherein the crystalline silicon particles contain hydrogen at a concentration of $1\times10^{16}$–$1\times10^{20}$ atoms/cm$^3$.

* * * * *